(12) United States Patent
Shi et al.

(10) Patent No.: US 10,408,042 B2
(45) Date of Patent: Sep. 10, 2019

(54) METHODS OF WELL TRAJECTORY AND DRILLING OPTIMIZED CONTROL FOR FRACTURE-VUGGY CARBONATE FORMATION

(71) Applicant: Drilling Research Institute of China National Petroleum Company, Beijing (CN)

(72) Inventors: Lin Shi, Beijing (CN); Yingcao Zhou, Beijing (CN); Wei Liu, Beijing (CN); Xiaoqiang Zhai, Beijing (CN); Ying Wang, Beijing (CN); Kai Wang, Beijing (CN); Boqi Zhou, Beijing (CN)

(73) Assignee: DRILLING RESEARCH INSTITUTE OF CHINA NATIONAL PETROLEUM COMPANY, Beijing (CN)

( * ) Notice: Subject to any disclaimer, the term of this patent is extended or adjusted under 35 U.S.C. 154(b) by 0 days.

(21) Appl. No.: 15/418,298

(22) Filed: Jan. 27, 2017

(65) Prior Publication Data
US 2017/0138175 A1  May 18, 2017

Related U.S. Application Data

(63) Continuation of application No. PCT/CN2015/085517, filed on Jul. 30, 2015.

(30) Foreign Application Priority Data

Jul. 30, 2014 (CN) .......................... 2014 1 0370845

(51) Int. Cl.
*E21B 47/024* (2006.01)
*E21B 7/04* (2006.01)
*E21B 49/00* (2006.01)

(52) U.S. Cl.
CPC .............. *E21B 47/024* (2013.01); *E21B 7/04* (2013.01); *E21B 49/003* (2013.01)

(58) Field of Classification Search
None
See application file for complete search history.

(56) References Cited

U.S. PATENT DOCUMENTS

| 4,386,665 A | 6/1983 | Dellinger |
| 5,812,068 A * | 9/1998 | Wisler .................... E21B 7/068 |
| | | 175/40 |

(Continued)

FOREIGN PATENT DOCUMENTS

| CN | 103046868 A | 4/2013 |
| CN | 103993831 A | 8/2014 |

(Continued)

OTHER PUBLICATIONS

Rao et al., An Integrated Solution in Drilling First Successful Horizontal Well in a Deep Carbonate Reservoir of North Kuwait, Mar. 2013, International Petroleum Technology Conference, pp. 1-8.*

(Continued)

*Primary Examiner* — Thai Q Phan
*Assistant Examiner* — Bernard E Cothran
(74) *Attorney, Agent, or Firm* — Calfee, Halter & Griswold LLP

(57) ABSTRACT

The invention discloses a series of methods to design drilling trajectory and control drilling operations in a optimized way in carbonate formation. The trajectory design method comprises: utilizing earthquake data to obtain contours of the carbonate rock fractures; determining a safe distance from each carbonate rock fracture; determining a segmented drilling trajectory for each fracture or vuggy structures in carbonate formation; and sequentially connect- (Continued)

ing the segmented drilling trajectories of neighboring fracture and vuggy to obtain a smooth horizontal drilling trajectory. The invention optimizes the carbonate rock reservoir drilling trajectory, thus improving connection between a horizontal well and the fractures. This reduces development costs, increases exploration and development efficiency and, at the same time, eliminates leaks resulting from the drilling process, thereby allowing for smooth drilling to a target well depth.

6 Claims, 3 Drawing Sheets

(56) References Cited

U.S. PATENT DOCUMENTS

| | | | | |
|---|---|---|---|---|
| 2005/0247447 | A1* | 11/2005 | Spring | E21B 43/119 166/55.2 |
| 2007/0168056 | A1* | 7/2007 | Shayegi | G05B 13/048 700/48 |
| 2011/0157235 | A1* | 6/2011 | FitzSimmons | G01V 99/00 345/672 |

FOREIGN PATENT DOCUMENTS

| | | |
|---|---|---|
| CN | 104265270 A | 1/2015 |
| CN | 104975808 A | 10/2015 |

OTHER PUBLICATIONS

Chen et al., A Multiply-Fractured Horizontal Well in a Rectangular Drainage Region, Dec. 1997, Society of Petroleum Engineers, vol. 2, pp. 455-465.*
Peacock et al., Controls of Fracturing in Carbonate Rocks, Mar. 2005, Society of Petroleum Engineers, pp. 1-6.*
YourDictionary, Structural dictionary definition, 2017, YourDictionary.com, pp. 1-3.*
Dictionary.com, Definition of contour, 2017, Dictionary.com, pp. 1-3.*
Berle et al., Determining the Oil-Water Contact while Drilling above the transition zone in long horizontal wells—Combining 4D Seisimc and advanced resistivity geosteering for improved wellbore placement, 2010, Society of Petrophysicists and Well Log Analysis (SPWLA), pp. 1-13.*
International Search Report and Written Opinion from PCT/CN/2015/085517 dated Nov. 20, 2015.
International Preliminary Report on Patentability from PCT/CN/2015/085517 dated Jan. 31, 2017.

* cited by examiner

METHODS OF WELL TRAJECTORY AND DRILLING OPTIMIZED CONTROL FOR FRACTURE-VUGGY CARBONATE FORMATION

CROSS-REFERENCE TO RELATED APPLICATIONS

This application is a continuation of PCT Application No. PCT/CN2015/085517 filed on Jul. 30, 2015, which claims priority to Chinese Application No. 201410370845.X filed on Jul. 30, 2014, the contents of which are hereby incorporated by reference as if recited in their entirety.

FIELD OF THE INVENTION

The invention relates to the field of petroleum and natural gas drilling, and in particular, to design a drilling trajectory and control drilling operations in an optimized way for fracture-vuggy carbonate formation.

BACKGROUND OF THE INVENTION

Oil and gas resources in West China are very abundant, but most of oil and gas in this region are concentrated in a deep formation; issues presented during exploration and development process is largely different from the oil and gas resources in a light formation, for example, the carbonate rock petroleum resource amount in Tarim Basin accounts for 38% of the total amount of the Basin.

For oil and gas exploration in carbonate formation, a horizontal well technology has been widely used. The horizontal well can improve productivity and reduce turbulence phenomenon. For the carbonate rock oil and gas resource, since the oil and gas distribution in carbonate formation has poor continuity and random distribution, and single well controlled reserves are different in size, the horizontal well is required to make multiple fractures linked with each other to improve productivity.

Since the fracture-vuggy structure of the carbonate rock reservoir is approximately formed into a bead shape, when exploited, the fractures need to be stringed together like tomatoes on sticks but cannot be opened; after drilling completes, the fractures are opened by measures such as fracturing and the like, so as to develop the oil and gas resources better. In order to safely string the fractures, it needs to design a chilling trajectory during the horizontal drilling process so that it not only can safely string the fractures but also conveniently open the fractures.

SUMMARY OF THE INVENTION

The object of the invention is to provide methods to design a drilling trajectory and control drilling operations in an optimized way for fracture-vuggy carbonate formation, realize safe and efficient exploitation on oil and gas resources.

To achieve the above object, an embodiment of the invention provides a method for designing a drilling trajectory for carbonate rock fractures, comprising: utilizing earthquake data to obtain contours of the carbonate rock fractures; determining a safe distance from each of the carbonate rock fractures; determining a segmented drilling trajectory for each of the carbonate rock fractures; and sequentially connecting the segmented drilling trajectories for neighboring carbonate rock fractures of the carbonate rock fractures to obtain the drilling trajectory for the carbonate rock fractures.

Preferably, the method further comprises determining a rectangular boundary.

Preferably, the rectangular boundary is the one that encompasses the contour of one of the carbonate rock fractures and has minimum area among horizontally placed rectangular boundaries.

Preferably, the safe distance from each of the carbonate rock fractures is a preset safe distance from an upper boundary of the rectangular boundary.

Preferably, the safe distance from each of the carbonate rock fractures is determined according to the following equation: $Y = 2y_i - y^*$, where y is the safe distance from the upper boundary of the rectangular boundary for the $i^{th}$ carbonate rock fracture, $$y* = \sum_{i=1}^{n} \alpha_i y_i, \quad \alpha_i = \frac{L_i}{\sum_{i=1}^{n} L_i}, \quad x \in L_i,$$

$y_i$ is a well depth at the upper boundary of the rectangular boundary of the $i^{th}$ carbonate rock fracture, x is a horizontal displacement for the $i^{th}$ horizontal trajectory with coordinates located within a corresponding $L_i$ segment, $L_i$ is a length of the rectangular boundary for the $i^{th}$ carbonate rock fracture in a horizontal direction.

Preferably, sequentially connecting drilling trajectories for the neighboring carbonate rock fractures of the carbonate rock fractures to obtain the chilling trajectory for the carbonate rock fractures comprises: connecting endpoints of the drilling trajectories for the neighboring carbonate rock fractures of the carbonate rock fractures to form two triangles; connecting the most remote endpoints of the drilling trajectories of the neighboring carbonate rock fractures using an S-shaped curve passing through common endpoints of the two triangles; sequentially connecting the S-shaped curves for the carbonate rock fractures to obtain the drilling trajectory for the carbonate rock fractures.

Preferably, the S-shaped curves are formed by combining two segments of circular arcs.

An embodiment of the invention provides a method for controlling a drilling trajectory for carbonate rock fractures, comprising: carrying out the carbonate rock fracture drilling using a drilling trajectory for the carbonate rock fractures obtained according to the above method; predicting/detecting a bottom hole pressure; on a condition that a change in engineering parameters exceeds a threshold, adjusting the bottom hole pressure such that the bottom hole pressure is constant or a flow is constant and making the drilling trajectory for the carbonate rock fractures is far away from the carbonate rock fractures.

The invention can optimize a drilling trajectory for a carbonate rock reservoir, and thus can improve connection between a horizontal well and the fractures. This can reduce development costs, increase exploration and development efficiency and eliminate leaks resulting from the drilling process, thereby allowing for smooth drilling to a target well depth.

Other features and advantages of the present invention will be further detailed in embodiments hereafter.

BRIEF DESCRIPTION OF DRAWINGS

The accompanying drawings are provided here to facilitate further understanding of the present invention, and constitute a part of this application. They are used in conjunction with the following embodiments to explain the present invention, but shall not be construed as constituting any limitation to the present invention, wherein.

DESCRIPTION OF THE SYMBOLS

| 1 | Long oval contour | 2 | Irregularly shaped contour |
|---|---|---|---|
| 3 | Short oval contour | 4 | Crack contour |
| 5, 7, 9, 11 | Lines parallel to upper boundaries for the fractures | | |
| 6, 8, 10 | Straight connecting lines | | |

DETAILED DESCRIPTION OF THE EMBODIMENTS

Hereafter some embodiments of the present invention will be detailed. They are used in conjunction with the following embodiments to explain the present invention, but shall not be construed as constituting any limitation to the present invention To design a safe and reasonable drilling trajectory for carbonate rock fractures, contours of the carbonate rock fractures may be obtained by analyzing earthquake history data at first. Since there is a deviation between geological structures obtained by the analysis of earthquake data and the actual geological structures, only the contours of the carbonate rock fractures can be obtained rather than accurately determining their shapes and sizes. In an ideal case, moving forward along the contours of the carbonate rock fractures during the drilling may perhaps happen; however it is not practical, and therefore a safety margin is needed to guarantee no leakage during the drilling. To facilitate determining the safety margin, the invention creates horizontally placed rectangular boundaries for individual carbonate rock fractures along the contours thereof, and then re-determines the safety margin on the basis of the rectangular boundaries. For the determination of the safety margin, the invention may employ two methods, one is to set a relatively constant safe distance for contours, and the other is to obtain a safe distance by modeling through extremum seeking method, wherein the safe distances may be different for carbonate rock fractures with different contours.

Figure 1:
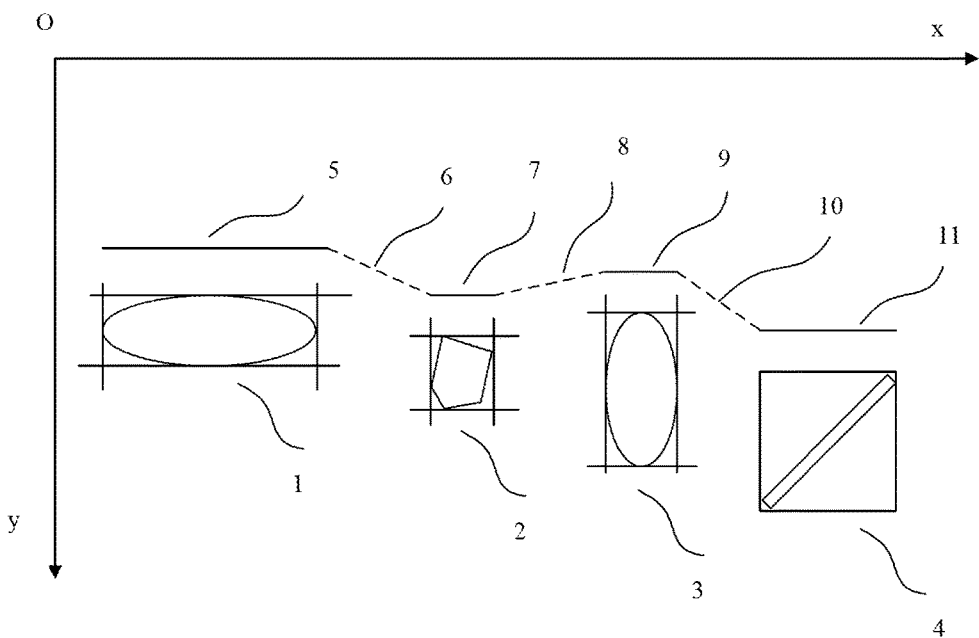
FIG. 1 is a schematic diagram of a safety margin constant distance method provided in the invention.

To facilitate illustration, the invention shows carbonate rock fractures with four different contours. Shown in FIG. 1 are a long oval contour 1, an irregularly shaped contour 2, a short oval contour 3 and a crack contour 4, and also shown corresponding rectangular boundaries for such different contours. For those skilled in the art, the rectangular boundaries that may encompass the contours of the carbonate rock fractures are the rectangular boundaries meeting requirements; however, in order to improve the oil and gas exploitation efficiency, it is desirable to use the rectangular boundary that has the minimum area and is horizontally placed. The rectangular boundary that has the minimum area and is horizontally placed may form point contact with various contours of different shapes.

Since the horizontal drilling is used in the oil and gas exploitation, after determining rectangular boundaries corresponding to the contours of the carbonate rock fractures, a fixed safety margin may be employed to design the drilling trajectory, for example, a line segment with the same length as the rectangular trajectory in the horizontal direction. The line segment is above the upper boundaries of the rectangular boundaries and at a fixed distance from the upper boundaries. That is, a segmented drilling trajectory can be formed, comprising for example, lines 5, 7, 9 and 11 parallel to the upper boundaries for the carbonate rock fractures. In order to form a continuous drilling trajectory, lines of lines 5, 7, 9 and 11 corresponding to neighboring carbonate rock fractures are required to be connected using straight connecting lines 6, 8 and 10 to form the drilling trajectory for the carbonate rock fractures. The segmented drilling trajectory is described by a mathematic method as follows:

piecewise function:

$$y = y_i - \Delta_i,\ i=1,\ldots,n,\ x \in L_i \tag{1}$$

$y_i$: a well depth at the upper boundary of the rectangular boundary for the $i^{th}$ carbonate cock fracture;

x: a horizontal displacement of the $i^{th}$ horizontal trajectory with coordinates located in the corresponding $L_i$ segment;

$\Delta_i$: is a safety margin, which may be an empirical value that varies from a fraction of meters to several meters.

$\min(\Delta_i) = 0$, $L_i$, is a length of parallel line segment for the fracture.

As described above, the safe distance may be determined by using an extremum seeking method. An upper boundary function for distance from a fracture string is represented by the following:

$$f(y) = \alpha_1(y - y_1)^2 + \alpha_2(y - y_2)^2 + \ldots + \alpha_n(y - y_n)^2 \tag{2}$$

$$\alpha_i = \frac{L_i}{\sum_{i=1}^{n} L_i} \tag{3}$$

In order to make the f(y) minimum, the first-order derivate is taken as zero, then:

$$f(y) = 0 \tag{4}$$

It is derived that:

$$\Sigma_{i=1}^{n} \alpha_i \cdot y = \Sigma_{i=1}^{n} \alpha_i y_i \tag{5}$$

since: $\Sigma_{i=1}^{n} \alpha_i = 1$ we have $$y = \Sigma_{i=1}^{n} \alpha_i y_i \tag{6}$$

which is denoted as:

$$y* = \sum_{i=1}^{n} \alpha_i y_i$$

To obtain a reasonable rectangular boundary, a boundary condition can be set to a well hole trajectory being above each of the carbonate rock fractures, then $$y - y_i \leq 0 \quad (7)$$

If the condition is satisfied, then:

$$y = y^*, \; x \in L_i \quad (8)$$

However, if the condition is not satisfied, that is, the well hole trajectory is below the carbonate rock fractures, then:

$$y^* - y_i \geq 0 \quad (9)$$

To facilitate drilling above the carbonate rock fractures, the drilling trajectory may be adjusted to the above, then the mapping is:

$$y = y_i - (y^* - y_i) = 2y_i - y^*, \; x \in L_i \quad (10)$$

According to the above equation (10), the safe distance for each carbonate rock fracture can be obtained so as to obtain the segmented drilling trajectories for the carbonate rock fractures, and the continuous drilling trajectory for the carbonate rock fractures can be obtained by sequentially connecting the segmented drilling trajectories for the carbonate rack fractures.

Figure 2:
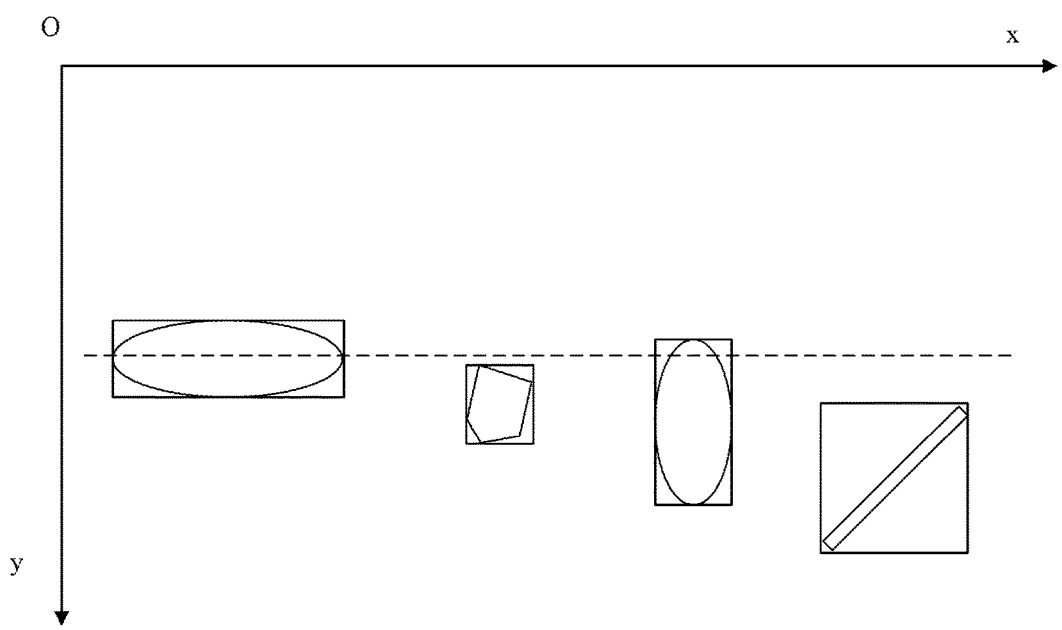
FIG. 2 is a schematic diagram of a horizontal line closest to an upper boundary of a string of the fractures provided in the invention.
Figure 3:
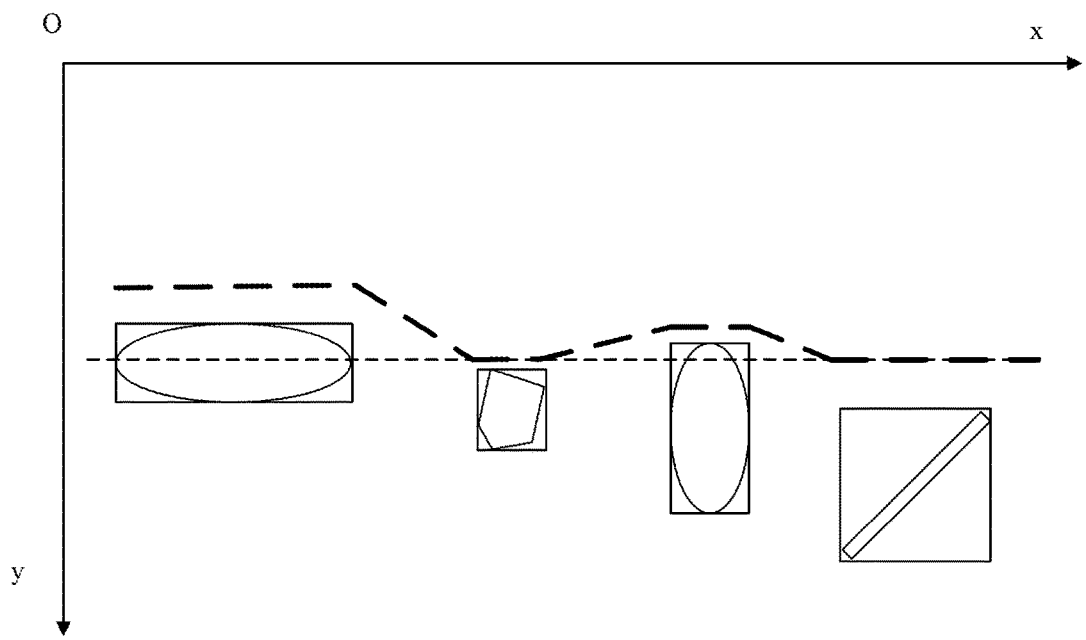
FIG. 3 is a schematic diagram of an adjusted trajectory based on a mapping according to the upper boundary provided in the invention.
Figure 4:
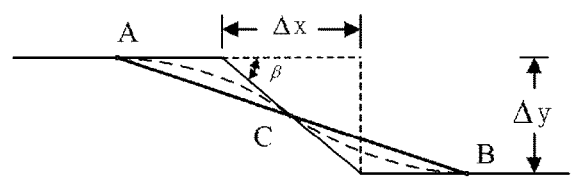
FIG. 4 is a schematic diagram of a curved transition between upper and lower parallel lines provided in the invention.

FIG. 2 shows a horizontal line closest to the upper boundaries for the carbonate rock fractures. FIG. 3 shows that the drilling trajectory is obtained according to the extremum seeking method. However, since the drilling bit is subjected to resistance from rock during the drilling process, the drilling bit cannot move forward according to the drilling trajectory formed from line segments as shown in FIG. 1 or 3. Therefore, the drilling trajectory is further optimized in embodiments of the invention. As shown in FIG. 4, two neighboring segmented chilling trajectories can form two triangles and the chilling trajectory is optimized by an S-shaped curve. The S-shaped curve can pass through the endpoints of the neighboring drilling trajectories which are farthest from each other, and can also pass through a common end of the two triangles; Preferably, the S-shaped curve can be formed by combining two circular arcs. The optimization result is described below using the mathematic method with respect to FIG. 4.

Two neighboring parallel line segments are represented with the following piecewise function:

$$\tan \beta = \frac{\Delta y}{\Delta x} \quad (11)$$

$\Delta y$ is a distance between the two parallel line segments, $\Delta x$ is a horizontal distance between two closest endpoints in the two parallel line segments; $\beta$ is in a unit of radian, which is converted into an angle:

$$\beta = \frac{180}{\pi} \arctan\left(\frac{\Delta y}{\Delta x}\right) \quad (12)$$

When the length of the straight line AC is half of the straight line AB, the length of arc AC may be considered to be approximately equal to the length of the line segment AC, which is denoted as M and is derived according to the geometric theorem:

$$M = \frac{\sqrt{\Delta x^2 + \Delta y^2}}{\cos(\beta/2)} \quad (13)$$

The length of abovementioned arc may be used as a reference factor for selecting a horizontal segment bent screw rod, for example, the horizontal segment bent screw rod satisfying the following condition may be selected:

$$\beta_z \cdot M \geq \beta \quad (14)$$

In the equation, $\beta_z$ is an angle building hole rate of the horizontal segment bent screw rod (degrees/30 meters). If the above condition is satisfied, a deflecting tool with the angle building hole rate may finish drilling for this segment.

Figure 5:
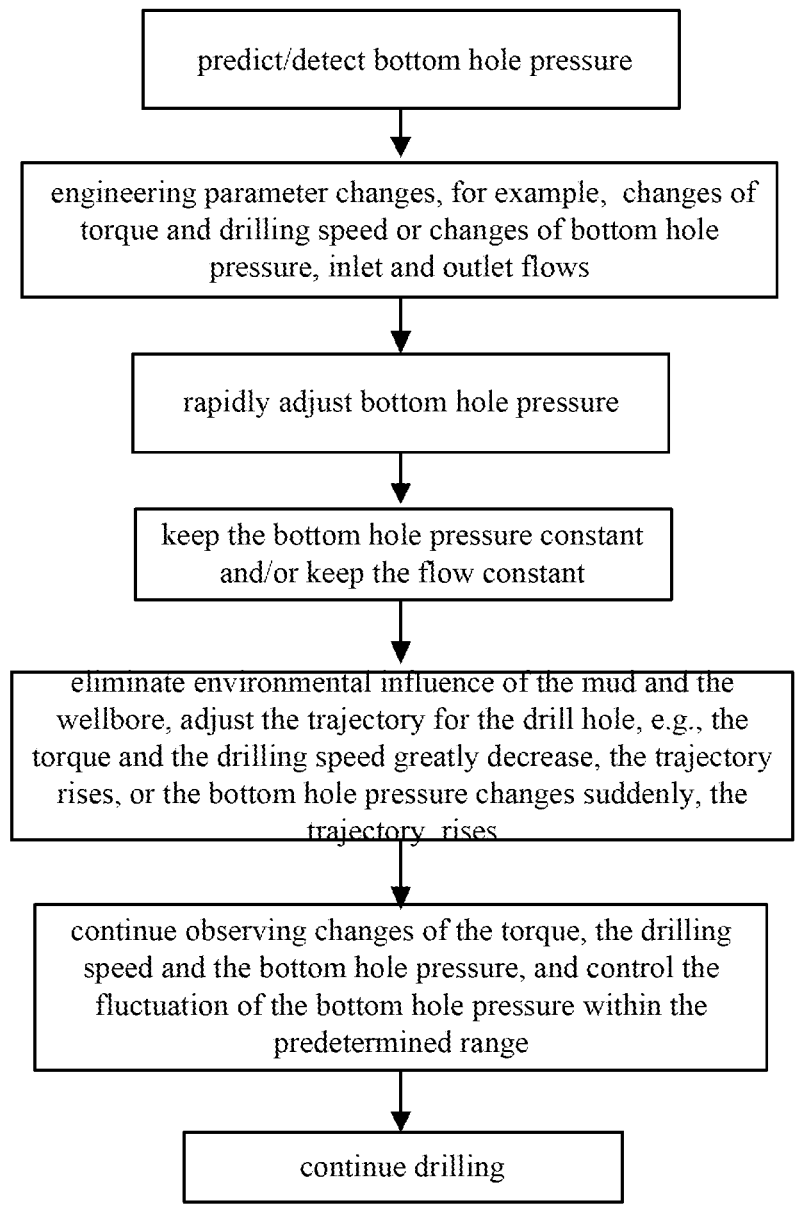
FIG. 5 is a schematic diagram of a method for a pressure and trajectory adjustment and control provided in the invention.

The invention can design safe and reasonable drilling trajectories for the carbonate rock fractures according to above solutions provided in embodiments of the invention. After obtaining the drilling trajectories, drilling can be performed according to the drilling trajectories. Since the earthquake data can be used to only draw contours of the carbonate rock fractures, the structure of formation cannot be fully understood, even if the safety margin has been considered during the process of designing the drilling trajectories, the situation that danger (e.g., leakage) still occurs during drilling according to the drilling trajectory; in order to prevent this danger from happening, the drilling trajectories need to be adjusted in time during the process of drilling. As shown in FIG. 5, during the adjustment of the trajectories, the bottom hole pressure needs to be predicted or detected in time; in the case that the drilling engineering parameters change, for example, changes in torque and drilling speed or the changes in the bottom hole pressure, inlet and outlet flows exceed the threshold. The threshold, for example, can be used to create the following equation according to a mechanical rock breaking principle: $C_r = a*WOB*/d_b^2 + b/(ROP*d_b^2)*(1+c*P_b*Q)$, where a, b and c are linear constants, which can be obtained by regression calculation in the field application under stable working conditions; WOB is a drilling pressure, $d_b$ is a drilling bit diameter, ROP is a mechanical drilling speed, $p_b$ is a bottom hole pressure, Q is a drilling liquid flow, $C_r$ is a calculated value, which may fluctuate within a range between a value below and a value above 10%-50% of the calculated value at a normal working condition; however, it may be determined by on-site engineers depending on actual conditions. In the case that the calculated value exceeds the range, the bottom hole pressure needs to be rapidly adjusted to avoid oil and gas leaking out of the carbonate rock fractures, and the drilling bit may be adjusted according to requirements for keeping the bottom hole pressure constant and/or keeping the flow constant to shift upward the drilling bit with respect to the originally designed drilling trajectory (that is, far away from the carbonate rock fractures); the trajectory is adjusted, based on the deflecting capability (e.g., the maximum deflecting capability) of the selected bent screw rod, to shift upward 1-2 meters and the drilling bit will horizontally drill along a drilling trajectory parallel to the predetermined drilling trajectory. It should be noted, the drilling trajectory in the preferred embodiment of the invention is located above the carbonate rock fracture, but the invention does not limit it. other drilling trajectories located in other orientations of the carbonate rock fractures are possible. In the process of controlling the drilling bit to be away from the carbonate rock fractures, engineering parameters also need to be detected, and a change in $C_r$ is calculated; if the calculated change satisfies the preset requirements (for example, $C_r$ fluctuating within a range between 90% and 110% of the $C_r$ at the normal working condition), for example, the bottom hole pressure fluctuates in the range of [−0.3, 0.3] Mpa, the drilling bit continues to move forward along the predetermined drilling trajectory. Through the above embodiments, the safe and efficient exploitation of oil and gas resource can be realized.

While some preferred embodiments of the present invention are described in detail above, the present invention is not limited to the details in those embodiments; Those skilled in the art can make modifications and variations to the technical solutions of the present invention, without departing from the spirit of the present invention. However, all these modifications and variations shall be deemed as falling into the scope of the present invention.

In addition, it should be appreciated that the technical features described in the above embodiments can be combined in any appropriate manner, provided that there is no conflict among the technical features in the combination. To avoid unnecessary iteration, such possible combinations are not described herein in the present invention.

Moreover, different embodiments of the present invention can be combined freely as required as long as the combinations do not deviate from the ideal and spirit of the present invention. However, such combinations shall also be deemed as falling into the scope disclosed in the present invention.

We claim:

1. A drilling method for carbonate rock fractures, the method comprises:
   determining contours of the carbonate rock fractures by analyzing earthquake history data;
   determining a rectangular boundary for each carbonate rock fracture based on the corresponding contours, wherein the rectangular boundary encompasses the contour of the carbonate rock fracture and has minimum area among horizontally placed rectangular boundaries;
   determining a safe distance from carbonate rock fracture, wherein the safe distance is a distance from upper boundary of the rectangular boundary and is determined according to the following equation:

$$Y=2y_i-y*$$

where y is the safe distance from the upper boundary of the rectangular boundary for the $i^{th}$ carbonate rock fracture, $y*=\Sigma_{i=1}^n L_i/\Sigma_{i=1}^n L_i y_i$, $x \in L_i$, $y_i$ is a well depth at the upper boundary of the rectangular boundary for the $i^{th}$ carbonate rock fracture, x is a horizontal displacement of the $i^{th}$ horizontal trajectory with coordinates located within a corresponding $L_i$ segment, $L_i$ is a length of the rectangular boundary for the $i^{th}$ carbonate rock fracture in a horizontal direction;

determining a segmented drilling trajectory for each of the carbonate rock fractures based on each rectangular boundary and the safe distance, wherein the segmented drilling trajectory is a trajectory along the safe distance above an upper boundary of the rectangular boundary;
   sequentially connecting the segmented drilling trajectories for neighboring carbonate rock fractures of the carbonate rock fractures to obtain a drilling trajectory for the carbonate rock fractures; and
   drilling with a drilling machine according to the drilling trajectory.

2. The method of claim 1, wherein sequentially connecting drilling trajectories for neighboring carbonate rock fractures of the carbonate rock fractures to obtain the drilling trajectory for the carbonate rock fractures comprises:
   connecting endpoints of the drilling trajectories for the neighboring carbonate rock fractures of the carbonate rock fractures to form two triangles;
   connecting the most remote endpoints of the drilling trajectories for the neighboring carbonate rock fractures of the carbonate rock fractures using an S-shaped curve passing through a common endpoint of the two triangles;
   sequentially connecting each S-shaped curve for the carbonate rock fractures to obtain the drilling trajectory for the carbonate rock fractures.

3. The method of claim 2, wherein the S-shaped curve is formed by combining two segments of circular arcs.

4. A method for controlling a drilling trajectory for carbonate rock fractures, the method comprises:
   carrying out the carbonate rock fracture drilling using a drilling trajectory for the carbonate rock fractures obtained from the method according to claim 1;
   predicting/detecting a bottom hole pressure;
   on a condition that a change in engineering parameters exceeds a threshold, adjusting the bottom hole pressure such that the bottom hole pressure is constant or a flow is constant, and making the drilling trajectory for the carbonate rock fractures far away from the carbonate rock fractures.

5. The method of claim 4, wherein making the drilling trajectory for the carbonate rock fractures far away from the carbonate rock fractures comprises:
   shifting upward the drilling trajectory for the carbonate rock fractures by a predetermined distance based on a deflecting capability of a bent screw rod; and
   drilling along the shifted drilling trajectory parallel to the drilling trajectory for the carbonate rock fractures.

6. The method of claim 4, wherein the engineering parameters comprise at least one of a drilling bit torque, a drilling speed, a bottom hole pressure and outlet and inlet flows.

* * * * *